US011417578B2

(12) United States Patent
Shiramizu et al.

(10) Patent No.: US 11,417,578 B2
(45) Date of Patent: Aug. 16, 2022

(54) SEMICONDUCTOR DEVICE, MANUFACTURING APPARATUS FOR SEMICONDUCTOR DEVICE AND MANUFACTURING METHOD FOR SEMICONDUCTOR DEVICE, AND SEMICONDUCTOR MODULE

(71) Applicant: Mitsubishi Electric Corporation, Tokyo (JP)

(72) Inventors: Masataka Shiramizu, Tokyo (JP); Hiroyuki Hata, Tokyo (JP); Yazhe Wang, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/972,334

(22) Filed: May 7, 2018

(65) Prior Publication Data

US 2018/0254231 A1 Sep. 6, 2018

Related U.S. Application Data

(62) Division of application No. 14/640,445, filed on Mar. 6, 2015, now Pat. No. 10,008,430.

(30) Foreign Application Priority Data

May 21, 2014 (JP) ................................ 2014-105223

(51) Int. Cl.
*H01L 21/56* (2006.01)
*H01L 23/31* (2006.01)
(Continued)

(52) U.S. Cl.
CPC ........ *H01L 23/3107* (2013.01); *H01L 21/565* (2013.01); *H01L 23/4006* (2013.01);
(Continued)

(58) Field of Classification Search
CPC ............................ H01L 21/5226; H01L 21/56
See application file for complete search history.

(56) References Cited

U.S. PATENT DOCUMENTS 4,843,695 A 7/1989 Doe et al.
5,044,912 A * 9/1991 Billings ............ B29C 45/14065 257/E21.504

(Continued)

FOREIGN PATENT DOCUMENTS

CN 1031446 A 3/1989
CN 1166057 A 11/1997

(Continued)

OTHER PUBLICATIONS

An Office Action mailed by the Japanese Patent Office dated Jul. 31, 2018, which corresponds to Japanese Patent Application No. 2017-117637 and is related to U.S. Appl. No. 15/972,334.

(Continued)

*Primary Examiner* — Sarah K Salerno
(74) *Attorney, Agent, or Firm* — Studebaker & Brackett PC

(57) ABSTRACT

A semiconductor device includes: a semiconductor element; a frame which has a first surface, holds the semiconductor element on the first surface, and is electrically connected with the semiconductor element; and a seal which has electrical insulation properties and seals the semiconductor element and the frame, wherein a through-hole is formed in the seal, the through-hole has a hole axis which extends in a direction intersecting with the first surface, and an inner peripheral end surface of the seal exposed inside the through-hole is inclined with respect to the hole axis.

1 Claim, 5 Drawing Sheets

300
8
22
51
1
5
2
52
21A
S
21
A
21B
21

(51) Int. Cl.

| | |
|---|---|
| ***H01L 23/40*** | (2006.01) |
| ***H01L 23/495*** | (2006.01) |
| ***H01L 23/00*** | (2006.01) |

(52) U.S. Cl.

CPC .. *H01L 23/49541* (2013.01); *H01L 23/49551* (2013.01); *H01L 23/49568* (2013.01); *H01L 24/83* (2013.01); *H01L 2924/13055* (2013.01); *H01L 2924/13091* (2013.01); *H01L 2924/171* (2013.01)

(56) References Cited

U.S. PATENT DOCUMENTS

| | | | | |
|---|---|---|---|---|
| 5,381,042 | A * | 1/1995 | Lerner | H01L 21/565 257/712 |
| 5,514,913 | A | 5/1996 | Mangiagli et al. | |
| 5,563,103 | A * | 10/1996 | Komatsu | B29C 45/14655 29/827 |
| 5,834,691 | A * | 11/1998 | Aoki | H01L 21/565 257/676 |
| 5,920,768 | A | 7/1999 | Shintai | |
| 5,939,779 | A | 8/1999 | Kim | |
| 6,177,718 | B1 * | 1/2001 | Kozono | H01L 21/565 257/666 |
| 6,373,124 | B1 | 4/2002 | Kato et al. | |
| 6,379,988 | B1 * | 4/2002 | Peterson | B81C 1/00333 257/E21.502 |
| 2002/0192876 | A1 * | 12/2002 | Boyaud | H01L 23/3128 438/127 |
| 2003/0183907 | A1 | 10/2003 | Hayashi et al. | |
| 2007/0278511 | A1 | 12/2007 | Ohno et al. | |
| 2009/0146272 | A1 | 6/2009 | Wieneke Kessler et al. | |
| 2010/0025828 | A1 | 2/2010 | Sakai | |
| 2010/0071887 | A1 | 3/2010 | Sugiyama et al. | |
| 2011/0266686 | A1 | 11/2011 | Yamaguchi | |
| 2012/0032346 | A1 | 2/2012 | Najafi et al. | |
| 2012/0075816 | A1 * | 3/2012 | Mashimo | H01L 23/3121 361/760 |
| 2012/0086003 | A1 | 4/2012 | Park | |
| 2012/0217616 | A1 * | 8/2012 | Matsuoka | H01L 23/49524 257/532 |
| 2014/0210093 | A1 * | 7/2014 | Wang | H01L 23/3107 257/773 |
| 2015/0060123 | A1 * | 3/2015 | Eugene Lee | H01L 23/49575 174/261 |

FOREIGN PATENT DOCUMENTS

| | | | |
|---|---|---|---|
| CN | 1649115 | A | 8/2005 |
| CN | 102354688 | A | 2/2012 |
| DE | 19716668 | A1 | 11/1997 |
| EP | 0299775 | A2 | 1/1989 |
| JP | S61-102040 | A | 5/1986 |
| JP | S63-170949 | A | 7/1988 |
| JP | H05-235074 | A | 9/1993 |
| JP | H10-032308 | A | 2/1998 |
| JP | 2000068432 | A | 3/2000 |
| JP | 2001-320185 | A | 11/2001 |
| JP | 2003-289085 | A | 10/2003 |
| JP | 2011114157 | A | 6/2011 |

OTHER PUBLICATIONS

An Office Action; "Notice of Reasons for Refusal," issued by the Japanese Patent Office dated Feb. 6, 2018, which corresponds to Japanese Patent Application No. 2017-117637 and is related to U.S. Appl. No. 14/640,445; with English language concise explanation.

An Office Action; "Grounds for Rejection" issued by the Chinese Patent Office dated May 25, 2017, which corresponds to Chinese Patent Application No. 201510262835.9 and is related to U.S. Appl. No. 14/640,445; with Englist language translation.

An Office Action; "Notice of Grounds of Rejection," issued by the Japanese Patent Office dated Feb. 7, 2017, which corresponds to Japanese Patent Application No. 2014-105223 and is related to U.S. Appl. No. 14/640,445; with English language partial translation.

An Office Action mailed by the Japanese Patent Office dated Sep. 3, 2019, which corresponds to Japanese Patent Application No. 2018-227534 and is related to U.S. Appl. No. 15/972,334; with English translation.

* cited by examiner

SEMICONDUCTOR DEVICE, MANUFACTURING APPARATUS FOR SEMICONDUCTOR DEVICE AND MANUFACTURING METHOD FOR SEMICONDUCTOR DEVICE, AND SEMICONDUCTOR MODULE

CROSS-REFERENCE TO RELATED APPLICATION

This application is a divisional of U.S. application Ser. No. 14/640,445 filed Mar. 6, 2015 and claims priority to Japanese Patent Application No. 2014-105223 filed May 21, 2014, the disclosure of which is incorporated by reference herein.

BACKGROUND OF THE INVENTION

Field of the Invention

The present invention relates to a semiconductor device, a manufacturing apparatus for the semiconductor device and a manufacturing method for the semiconductor device, and a semiconductor module. In particular, the present invention relates to a fully-molded type semiconductor device in which a power semiconductor element is covered with a seal around the entire periphery thereof and is electrically insulated from the outside, a manufacturing apparatus for the semiconductor device and a manufacturing method for the semiconductor device, and a semiconductor module.

Description of the Background Art

A semiconductor device capable of handling large electric power is generally called a power device. Such a semiconductor device is required to have a high dielectric strength in order to handle large electric power.

In a fully-molded type semiconductor device, the entire periphery of a power semiconductor element is covered with a seal having electrical insulation properties in order to achieve a high dielectric strength.

Japanese Patent Laying-Open No. 2003-289085 describes a fully-molded type semiconductor device secured and fixed to a heat-dissipating fin using screws, and provided with mounting holes in a sealing resin.

SUMMARY OF THE INVENTION

However, in a conventional fully-molded type semiconductor device, there have been cases where a sufficient dielectric strength cannot be obtained.

Generally, a semiconductor device is connected and fixed to a heat dissipator using screws or the like, at the outside thereof. On that occasion, the semiconductor device cannot obtain a sufficient dielectric strength when a lead electrically connected with a power semiconductor element and a die pad equipped with the power semiconductor element are close to the heat dissipator and the screws or the like.

The present invention has been made to solve the aforementioned problem. A main object of the present invention is to provide a semiconductor device having a high dielectric strength, a manufacturing apparatus for the semiconductor device and a manufacturing method for the semiconductor device, and a semiconductor module.

A semiconductor device in accordance with the present invention is a semiconductor device including: a semiconductor element; a frame which has a first surface and a second surface located opposite to the first surface, holds the semiconductor element on the first surface, and is electrically connected with the semiconductor element; and a seal which has electrical insulation properties and seals the semiconductor element and the frame. A through-hole is formed in the seal, the through-hole has a hole axis which extends in a direction intersecting with the first surface, and an inner peripheral end surface of the seal exposed inside the through-hole is inclined with respect to the hole axis.

According to the present invention, a semiconductor device having a high dielectric strength, a manufacturing apparatus for the semiconductor device and a manufacturing method for the semiconductor device, and a semiconductor module can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
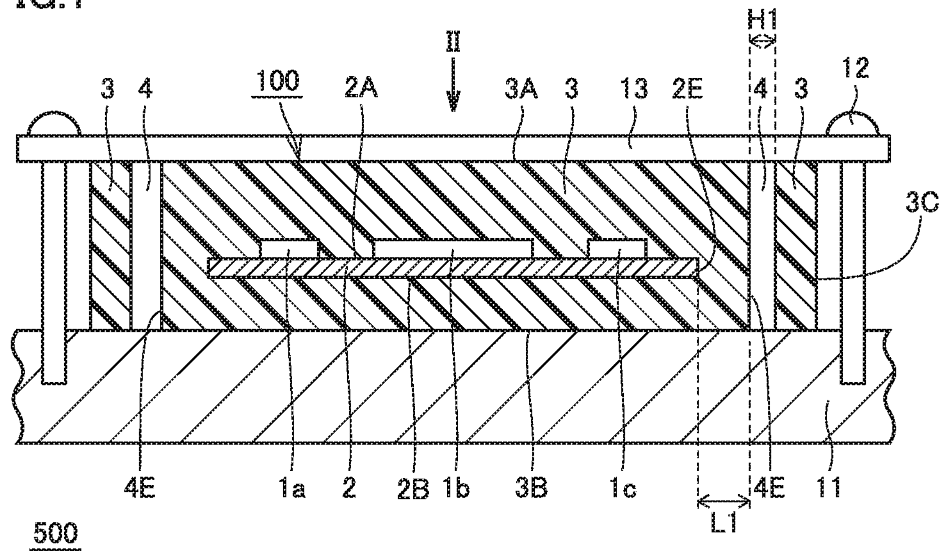
FIG. 1 is a cross sectional view for illustrating a semiconductor device in accordance with Embodiment 1.

Hereinafter, embodiments of the present invention will be described with reference to the drawings. It is noted that identical or corresponding parts in the drawings will be designated by the same reference numerals, and the description thereof will not be repeated.

Embodiment 1

Figure 2:
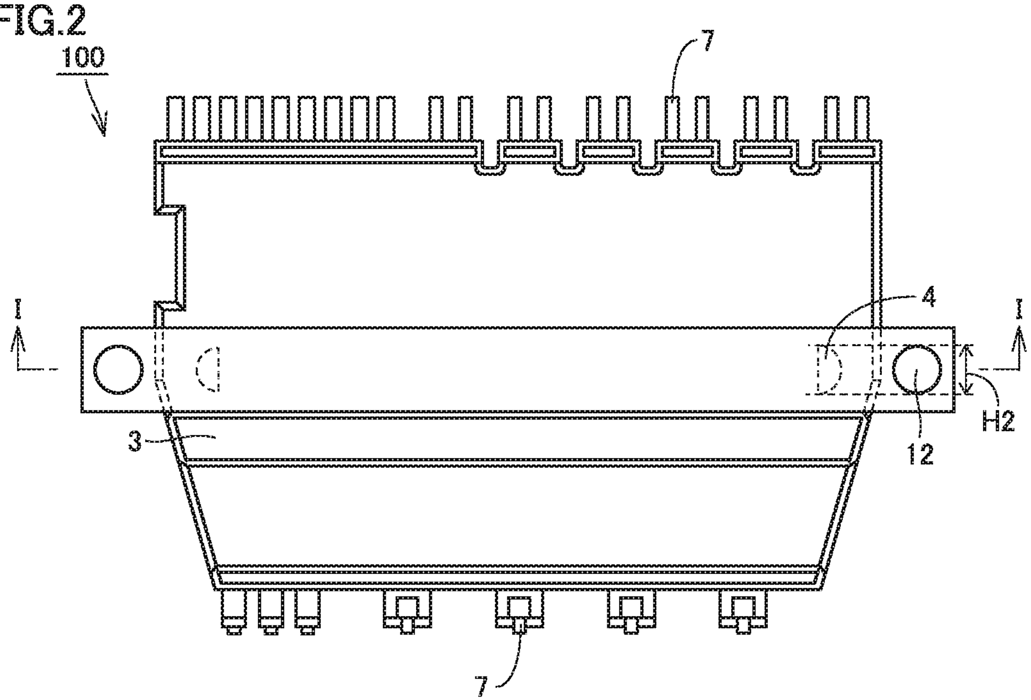
FIG. 2 is a top view for illustrating the semiconductor device in accordance with Embodiment 1.

A semiconductor device in accordance with Embodiment 1 will be described with reference to FIGS. 1 and 2. A semiconductor device 100 in accordance with Embodiment 1 includes a semiconductor element 1, a frame 2, and a seal 3.

Semiconductor element 1 can be any power semiconductor element, and is, for example, an insulated gate bipolar transistor (IGBT) or a MOS field effect transistor (MOSFET). In semiconductor device 100, a plurality of semiconductor elements 1 may be formed.

Frame 2 has a first surface 2A and a second surface 2B located opposite to first surface 2A, holds semiconductor element 1 on first surface 2A, and is electrically connected with semiconductor element 1. Frame 2 extends to the outside of seal 3 described later, and plays a role to electrically connect semiconductor element 1 and the outside. Semiconductor device 100 in accordance with Embodiment 1 may include a plurality of frames 2. Frame 2 has connection portions 7 (see FIG. 2) exposed from seal 3, and end portions 2E (see FIG. 1) covered with seal 3. The material constituting frame 2 can be any material having electrical conductivity, and is, for example, a material containing copper (Cu). It is noted that frame 2 may have a die pad 5 (see FIG. 7) holding semiconductor element 1, and a frame body portion 6 (see FIG. 7) connected with die pad 5. Connection portions 7 may be provided to be bent in a direction perpendicular to first surface 2A, or may be provided to extend in the same plane as first surface 2A.

Seal 3 has electrical insulation properties. Seal 3 covers semiconductor element 1 and at least a portion of frame 2, and thereby physically and chemically protects them. As the material constituting seal 3, any material having electrical insulation properties and having flowability under predetermined conditions can be adopted, and is, for example, epoxy resin. Seal 3 can be formed, for example, by the transfer mold method.

An outer peripheral surface of seal 3 has an upper surface 3A located above semiconductor element 1 and frame 2, a lower surface 3B located below semiconductor element 1 and frame 2, and side end surfaces 3C connecting upper surface 3A and lower surface 3B. Upper surface 3A and lower surface 3B are formed to extend along first surface 2A of frame 2, and preferably formed to be parallel to first surface 2A. Through-holes 4 penetrating from upper surface 3A to lower surface 3B are formed in seal 3. That is, a hole axis of each through-hole 4 extends in a direction intersecting with first surface 2A. Preferably, the hole axis of through-hole 4 is provided perpendicular to first surface 2A. It is noted that a hole axis means an axis which passes through the center of through-hole 4 and extends along through-hole 4.

Through-hole 4 may have any shape, and has, for example, a shape formed by partially filling a through-hole having a predetermined shape, with seal 3. For example, through-hole 4 has a semicircular shape formed by filling half of a region inside a common through-hole formed in a conventional power semiconductor device, which has the shape of a circle with a hole diameter H2 (a radius H1), with seal 3. In this case, a planar shape of through-hole 4 has one side having a length equal to hole diameter H2, and a semicircular arc with radius H1.

In through-hole 4, the one side having a length equal to hole diameter H2 may be formed at a position closest to frame 2. From a different viewpoint, through-hole 4 in semiconductor device 100 in accordance with Embodiment 1 may be formed at the same position as a portion (for example, half) of the common through-hole formed in the conventional power semiconductor device, and may have a shape formed by filling a portion thereof on a side close to frame 2 (i.e., a portion of an inner peripheral end surface of the through-hole which includes a region having the shortest distance from frame 2), with seal 3.

Hole diameter H2 of through-hole 4 can be arbitrarily determined, irrespective of the diameter of a shaft of a fixing member 12 (for example, an effective diameter of a screw). Hole diameter H2 of through-hole 4 may be the same as the diameter of the shaft of fixing member 12, or may be shorter than that.

Through-hole 4 is formed in a region not overlapping with frame 2. On this occasion, an inner peripheral end surface 4E of seal 3 exposed inside through-hole 4 and end portion 2E of frame 2 are apart from each other by a predetermined distance.

A pressing member 13 which presses upper surface 3A of seal 3 from above is fixed, by fixing members 12, to a heat dissipator 11 on which lower surface 3B of seal 3 is placed in contact therewith, and thereby semiconductor device 100 constitutes a semiconductor module 500. In heat dissipator 11, holes to which fixing members 12 can be fixed are formed at positions corresponding to through-holes 4. Fixing member 12 may be made of a material having electrical conductivity, and may be, for example, a screw made of a steel material. The holes in heat dissipator 11 are screw holes provided to be capable of securing fixing members 12 therein. In pressing member 13, holes through which fixing members 12 can pass are formed at positions corresponding to through-holes 4. Pressing member 13 is, for example, a plate spring.

In semiconductor device 100 in accordance with Embodiment 1, fixing members 12 are connected and fixed to heat dissipator 11, and provided to connect pressing member 13 at the outside of semiconductor device 100. Through-hole 4 is not a hole for allowing fixing member 12 to pass therethrough. Thus, radius H1 of through-hole 4 can be arbitrarily determined, irrespective of the effective diameter of fixing member 12 or the like, as described above.

Each through-hole 4 is provided at a position overlapping with pressing member 13 when pressing member 13 is fixed to heat dissipator 11 by fixing members 12 and thereby semiconductor device 100 is sandwiched between heat dissipator 11 and pressing member 13. Hole diameter H2 of through-hole 4 can be set, for example, to be approximately equal to the width of pressing member 13 (width in a short direction).

Next, a manufacturing method for semiconductor device 100 in accordance with Embodiment 1 will be described. The manufacturing method for semiconductor device 100 in accordance with Embodiment 1 can be any method as long as through-holes 4 can be formed in seal 3, and is, for example, the transfer mold method which supplies a thermosetting resin into a mold, as a flowable material which is to serve as seal 3.

First, a material to be sealed 8, which includes semiconductor element 1 and frame 2 holding semiconductor element 1 on a surface thereof, is prepared. In material to be sealed 8, semiconductor element 1 and frame 2 are electrically connected. Next, a mold is prepared. The mold has a space surrounded by an inner peripheral surface corresponding to the outer peripheral surface of seal 3 (upper surface 3A, lower surface 3B, side end surfaces 3C) and structures corresponding to inner peripheral end surfaces 4E of through-holes 4, and is provided to be capable of holding material to be sealed 8 inside the space. It is noted that the mold has a connection path which connects the space and the outside of the mold.

Next, a material having flowability which is to serve as the seal (hereinafter referred to as a flowable material) is supplied into the mold. The flowable material is, for example, epoxy resin. The flowable material fills the space inside the mold in which material to be sealed 8 is held, through the connection path provided in the mold. Filling of the flowable material is performed until there is no cavity inside the mold.

Next, the flowable material is heated and cured. Thereby, semiconductor device 100 in which material to be sealed 8 is covered with seal 3 and through-holes 4 are formed in seal 3 can be obtained.

Next, the function and effect of semiconductor device 100 in accordance with Embodiment 1 will be described. Semiconductor device 100 includes semiconductor element 1; frame 2 which has first surface 2A, holds semiconductor element 1 on first surface 2A, and is electrically connected with semiconductor element 1; and seal 3 which has electrical insulation properties and seals semiconductor element 1 and frame 2. Through-holes 4 are formed in seal 3, each through-hole 4 has a hole axis which extends in the direction intersecting with first surface 2A, and inner peripheral end surface 4E of seal 3 exposed inside through-hole 4 is inclined with respect to the hole axis.

Further, through-hole 4 is not a hole through which fixing member 12, which fixes semiconductor element 1 to heat dissipator 11, is inserted and secured, and fixing member 12 is provided outside seal 3 for semiconductor element 1. Thus, the distance between end portion 2E of frame 2 and fixing member 12 can be increased. Thereby, the dielectric strength of semiconductor element 1 can be improved, when compared with a conventional power semiconductor element using through-hole 4 formed in seal 3 as an insertion hole for fixing member 12.

Further, when inner peripheral end surface 4E of through-hole 4 is a surface which has one side having a length equal to radius H1, and inner peripheral end surface 4E is exposed inside through-hole 4 to face a side opposite to frame 2, a shortest distance L1 between end portion 2E of frame 2 and inner peripheral end surface 4E of through-hole 4 can be increased.

It is noted that each through-hole 4 is provided at the position overlapping with pressing member 13 when pressing member 13 is fixed to heat dissipator 11 by fixing members 12 and thereby semiconductor device 100 is sandwiched between heat dissipator 11 and pressing member 13. Thus, through-holes 4 can serve as guides used when semiconductor device 100 is positioned with respect to pressing member 13 connected to heat dissipator 11 by fixing members 12. In particular, when hole diameter H2 of through-hole 4 is set to be approximately equal to the width of pressing member 13 (width in the short direction), positioning can be performed more easily at the time of assembly, by designing semiconductor module 500 such that, when semiconductor module 500 is viewed in a top view, through-holes 4 are not exposed at all from under pressing member 13. It is noted that through-hole 4 may be formed to extend from upper surface 3A toward lower surface 3B by a predetermined distance, and may not penetrate to lower surface 3B. In other words, through-hole 4 may be formed as a concave portion in upper surface 3A. In this case, through-hole 4 as a concave portion has a bottom surface made of seal 3, and preferably the distance between upper surface 3A and the bottom surface is provided to be shorter than the distance between frame 2 and upper surface 3A in semiconductor device 100. Also with such a configuration, semiconductor device 100 having a high dielectric strength and allowing easy positioning when semiconductor module 500 is assembled can be obtained.

Embodiment 2

Figure 3:
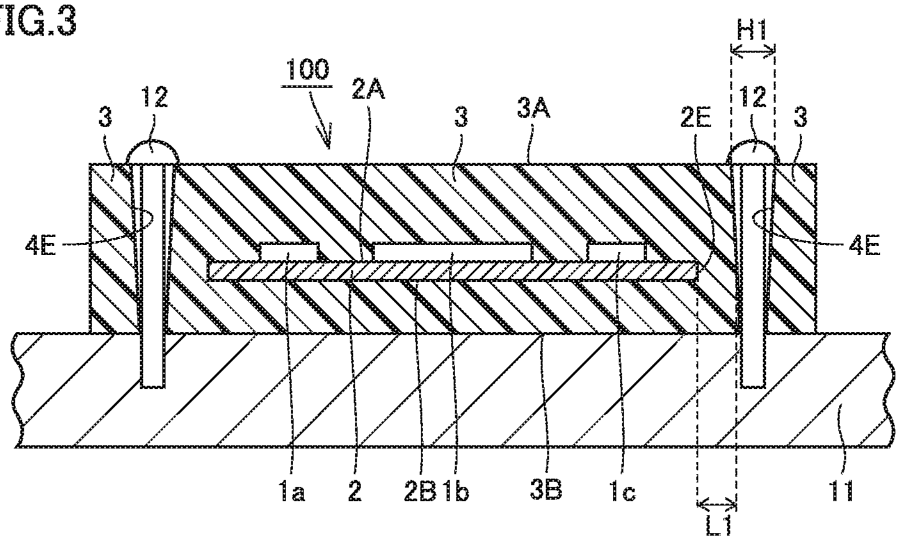
FIG. 3 is a cross sectional view for illustrating a semiconductor device in accordance with Embodiment 2.

Next, semiconductor device 100 in accordance with Embodiment 2 will be described with reference to FIG. 3. Although semiconductor device 100 in accordance with Embodiment 2 basically has the same configuration as that of semiconductor device 100 in accordance with Embodiment 1, semiconductor device 100 in accordance with Embodiment 2 is different from semiconductor device 100 in accordance with Embodiment 1 in that through-hole 4 is a hole for allowing fixing member 12 to pass therethrough, and inner peripheral end surface 4E of seal 3 exposed inside through-hole 4 is inclined with respect to the hole axis of through-hole 4.

The hole axis of through-hole 4 only has to extend in the direction intersecting with first surface 2A of frame 2 at any angle, and for example, is formed such that first surface 2A of frame 2 is parallel to upper surface 3A and lower surface 3B of seal 3, and the hole axis extends in a direction perpendicular to these surfaces.

Inner peripheral end surface 4E of through-hole 4 is not perpendicular, but is inclined at a predetermined angle, with respect to upper surface 3A which is not in contact with heat dissipator 11 in seal 3 and lower surface 3B which is in contact with heat dissipator 11 in seal 3. Preferably, inner peripheral end surface 4E is provided to intersect with upper surface 3A at an obtuse angle and intersect with lower surface 3B at an acute angle. From a different viewpoint, it is preferable that inner peripheral end surface 4E is provided such that an opening area of through-hole 4 in upper surface 3A is larger than an opening area of through-hole 4 in lower surface 3B. It is noted that dimensions of through-hole 4 in lower surface 3B are provided to be more than or equal to dimensions of the shaft of fixing member 12.

With such a configuration, even if the opening area of through-hole 4 in upper surface 3A is provided to be equal to that of the through-hole for allowing a fixing member to pass therethrough provided in the conventional power semiconductor device, shortest distance L1 between end portion 2E of frame 2 and inner peripheral end surface 4E can be increased, when compared with the conventional power semiconductor device formed such that inner peripheral end surface 4E of through-hole 4 extends in the direction perpendicular to upper surface 3A and lower surface 3B. As a result, even when fixing member 12 passes through through-hole 4, seal 3 provided between end portion 2E of frame 2 and fixing member 12 can be formed thicker, while the distance therebetween is equal to that of the conventional power semiconductor device. Therefore, the dielectric strength of semiconductor device 100 can be improved.

Preferably, frame 2 is provided within a half region of semiconductor device 100 located on a lower side in a vertical direction. Thereby, shortest distance L1 between end portion 2E of frame 2 and inner peripheral end surface 4E of through-hole 4 can be further increased, and the dielectric strength of semiconductor device 100 can be improved.

Fixing member 12 may be entirely accommodated inside through-hole 4 including a head thereof, or the head may protrude outside through-hole 4. Further, for example, the shaft of fixing member 12 may be formed to extend along inner peripheral end surface 4E of through-hole 4.

It is noted that, since semiconductor device 100 in accordance with Embodiment 2 is connected and fixed to heat dissipator 11 by fixing members 12 inserted into through-holes 4, pressing member 13 can be eliminated.

Embodiment 3

Figure 4:
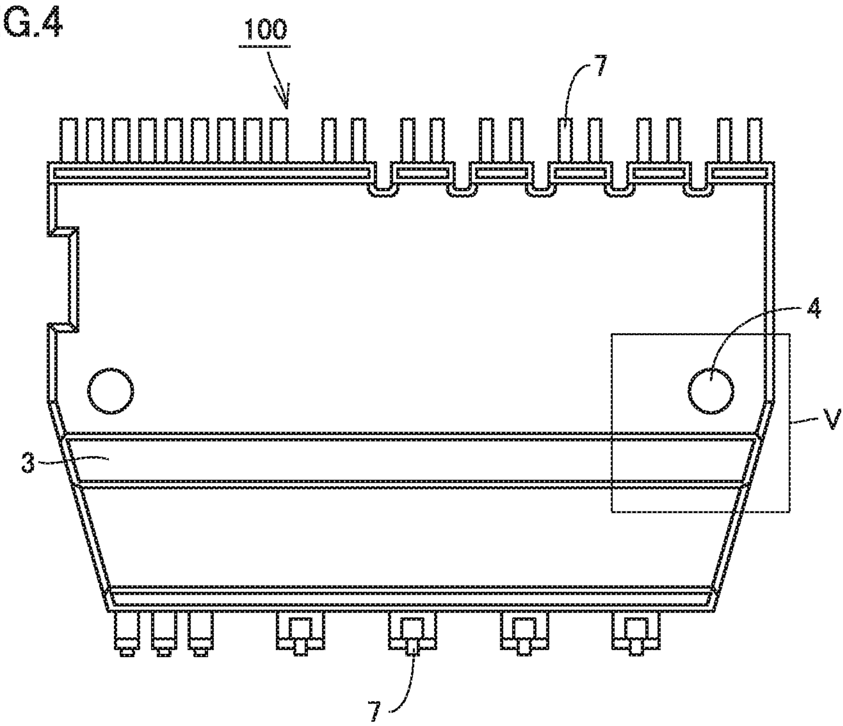
FIG. 4 is a top view for illustrating a semiconductor device in accordance with Embodiment 3.
Figure 5:
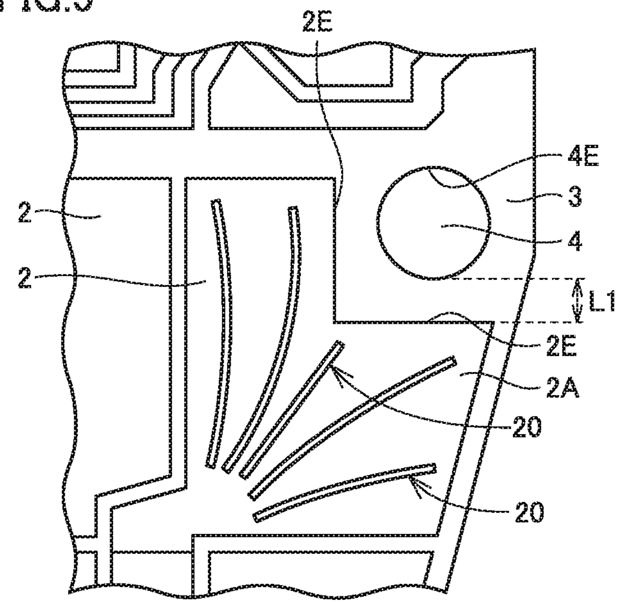
FIG. 5 is a view for illustrating an internal structure of the semiconductor device in a region V shown in FIG. 4.

Next, semiconductor device 100 in accordance with Embodiment 3 will be described with reference to FIGS. 4 and 5. Although semiconductor device 100 in accordance with Embodiment 3 basically has the same configuration as that of semiconductor device 100 in accordance with Embodiment 2, semiconductor device 100 in accordance with Embodiment 3 is different from semiconductor device 100 in accordance with Embodiment 2 in that a flow control pattern 20, which restricts a flow direction of the flowable material which is to serve as seal 3 when seal 3 is formed, is formed on first surface 2A of frame 2 adjacent to through-hole 4.

A plurality of flow control patterns 20 are provided on first surface 2A of frame 2. Flow control patterns 20 are provided independently from each other at predetermined intervals. Each flow control pattern 20 is provided to protrude from first surface 2A of frame 2 in the direction perpendicular to first surface 2A, and provided to extend toward end portion 2E of frame 2 located close to through-hole 4. It is noted that flow control pattern 20 can have any shape as long as it can restrict the flow direction of the flowable material.

With such a configuration, the flow direction of the flowable material is restricted by flow control patterns 20 when the flowable material which is to serve as seal 3 is supplied into the space inside the mold in which material to be sealed 8 including semiconductor element 1 and frame 2 is held. On this occasion, the flowable material flows inside the mold by being guided by flow control patterns 20 formed to extend toward end portion 2E of frame 2 located close to a region in which through-hole 4 is formed. As a result, even if shortest distance L1 between end portion 2E of frame 2 and inner peripheral end surface 4E of through-hole 4 is increased when compared with that of the conventional semiconductor device and thereby the distance for which the flowable material which is to serve as seal 3 flows along frame 2 is decreased, a resultant change in the flow direction of the flowable material can be suppressed. In other words, since flow control patterns 20 formed on frame 2 can play a role to control the flow direction of the flowable material which is to serve as the seal in a resin sealing step, which has been played by the frame in the conventional semiconductor device, flow control patterns 20 allow the flowable material to flow efficiently around through-hole 4 even if frame 2 itself has a shorter length. Thereby, semiconductor device 100 has a high dielectric strength, and formability of through-hole 4 can be improved.

Any shape can be adopted as a planar shape of frame 2 in first surface 2A. For example, frame 2 may be provided such that, when semiconductor device 100 is viewed from the upper surface 3A side, frame 2 has end portion 2E including two sides which face through-hole 4 provided in a circular shape, and the two sides are orthogonal to each other.

In this case, when shortest distance L1 between end portion 2E of frame 2 and inner peripheral end surface 4E of through-hole 4 is longer than that of the conventional semiconductor device as described above, the distance between frame 2 and fixing member 12 also becomes more than or equal to shortest distance L1 in a case where fixing member 12 is inserted into through-hole 4 and secured to heat dissipator 11 or the like to fix semiconductor element 1. Thus, semiconductor device 100 can have a high dielectric strength. Further, in most of the region in which end portion 2E of frame 2 and inner peripheral end surface 4E of through-hole 4 face each other with seal 3 interposed therebetween, the distance therebetween is set to be longer than shortest distance L1, and thus the risk of breakdown can be further reduced.

It is noted that flow control patterns 20 only have to be formed on at least one of first surface 2A and second side 2B of frame 2. In addition, when frame 2 has die pad 5 (see FIG. 7) and frame body portion 6, flow control patterns 20 only have to be formed on at least one of die pad 5 and frame body portion 6 close to through-hole 4, and further, flow control patterns 20 only have to be formed on a surface of at least one of them.

Embodiment 4

Figure 6:
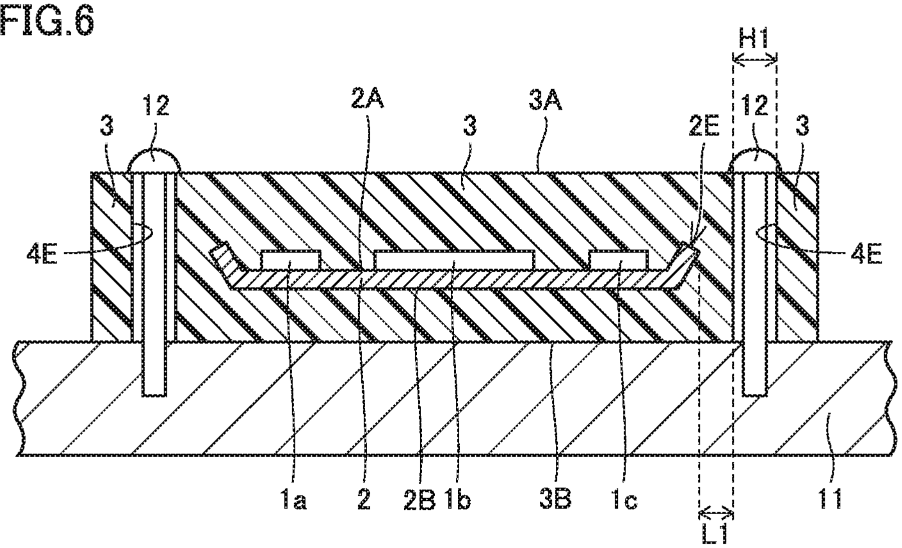
FIG. 6 is a cross sectional view for illustrating a semiconductor device in accordance with Embodiment 4.

Next, semiconductor device 100 in accordance with Embodiment 4 will be described with reference to FIG. 6. Although semiconductor device 100 in accordance with Embodiment 4 basically has the same configuration as that of semiconductor device 100 in accordance with Embodiment 2, semiconductor device 100 in accordance with Embodiment 4 is different from semiconductor device 100 in accordance with Embodiment 2 in that end portion 2E of frame 2 arranged to face inner peripheral end surface 4E of seal 3 exposed inside through-hole 4 is bent in the direction intersecting with first surface 2A.

Frame 2 has a structure in which a plate-like conductive member is bent upward or downward at a point apart from end portion 2E by a predetermined distance (hereinafter referred to as a bending point). The conductive member constituting frame 2, in a state where it is not bent, may have a configuration equal to that of the frame in the conventional semiconductor device, and specifically may have equal dimensions. Also with such a configuration, the shortest distance from the bending point to a point where end portion 2E is located in frame 2 when frame 2 is viewed in a plan view corresponds to the length of the base of a triangle whose hypotenuse is a bent portion located from the bending point to end portion 2E in frame 2, and thus the shortest distance is shorter than the length from the bending point to end portion 2E, that is, the shortest distance in the conventional frame which is not bent. Accordingly, even in a case where fixing members 12 are provided in through-holes 4 to fix semiconductor device 100 to heat dissipator 11 or the like using through-holes 4 and fixing members 12 having dimensions equal to those of the conventional semiconductor device, the shortest distance between frame 2 and fixing member 12 can be increased, and the dielectric strength of semiconductor device 100 can be improved.

It is noted that the bent portion of frame 2 can have any shape, and for example, may be bent downward or bent perpendicular to first surface 2A. Also with such a configuration, end portion 2E of frame 2 can be located sufficiently apart from fixing member 12 arranged inside through-hole 4, when compared with the conventional semiconductor device. As a result, dielectric strength can be improved without any change in the dimensions or the like of the conventional semiconductor device.

Although semiconductor module 500 is fixed to heat dissipator 11 by fixing members 12 only, without using pressing member 13, in semiconductor device 100 in accordance with each of Embodiments 2 to 4 described above, semiconductor module 500 is not limited thereto. Semiconductor device 100 in accordance with each embodiment may be configured as semiconductor module 500 using pressing member 13, as with semiconductor device 100 in accordance with Embodiment 1.

Embodiment 5

Figure 7:
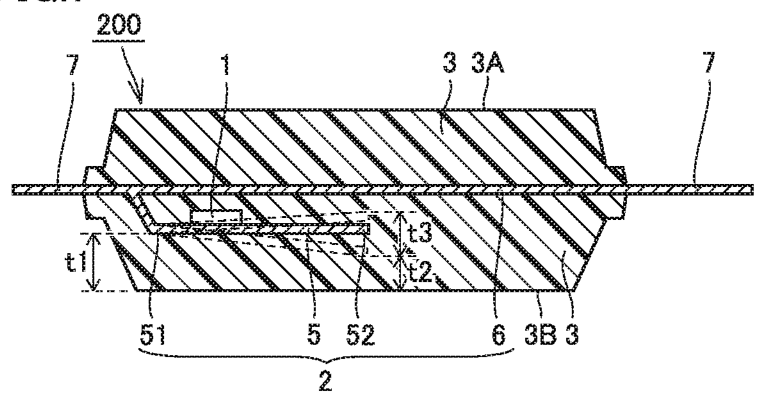
FIG. 7 is a cross sectional view for illustrating a semiconductor device in accordance with Embodiment 5.

Next, a semiconductor device 200 in accordance with Embodiment 5 will be described with reference to FIG. 7. Semiconductor device 200 in accordance with Embodiment 5 includes semiconductor element 1, frame 2, and seal 3 which seals semiconductor element 1 and frame 2. Frame 2 includes die pad 5 holding at least one semiconductor element 1 on a surface thereof and frame body portion 6 connected with die pad 5, and is electrically connected with semiconductor element 1.

In semiconductor device 200, die pad 5 is located below frame body portion 6 in the vertical direction, and is connected with frame body portion 6. Die pad 5 has a first end portion 51 located on a side close to a connection portion connected with frame body portion 6, and a second end portion 52 located opposite to first end portion 51.

Die pad 5 may not be provided in parallel with frame body portion 6 or lower surface 3B of seal 3. That is, in a direction perpendicular to frame body portion 6, second end portion 52 may be located on a side closer to frame body portion 6 or on a side more apart from frame body portion 6, than first end portion 51. On this occasion, frame 2 is provided such that second end portion 52 of die pad 5 has a predetermined positional relationship with respect to first end portion 51 in the direction perpendicular to frame body portion 6.

Specifically, second end portion 52 may be provided to be closer to frame body portion 6 than first end portion 51, in the direction perpendicular to frame body portion 6, with 50 μm set as an upper limit value. Further, second end portion 52 may be provided to be more apart from frame body portion 6 than first end portion 51, in a direction apart from frame body portion 6, with 100 μm set as an upper limit value. In other words, when the point where first end portion 51 is located is defined as a zero point and the side more apart from frame body portion 6 is defined as a positive side in the direction perpendicular to frame body portion 6 (i.e., the vertical direction when semiconductor device 200 is assembled), second end portion 52 is provided within a range of more than or equal to −50 μm and less than or equal to 100 μm (range t3 in FIG. 7).

Semiconductor device 200 in accordance with Embodiment 5 is configured such that frame body portion 6 in such frame 2 is substantially parallel to lower surface 3B of seal 3. On this occasion, the shortest distance between second end portion 52 of die pad 5 and the outer peripheral surface of seal 3 is a shortest distance t2 between second end portion 52 and lower surface 3B, and is more than or equal to a lower limit distance which is 100 μm shorter than a shortest distance t1 between first end portion 51 and the outer peripheral surface (lower surface 3B) of seal 3, and is less than or equal to an upper limit distance which is 50 μm longer than shortest distance t1 between first end portion 51 and the outer peripheral surface (lower surface 3B) of seal 3.

The shortest distance between first end portion 51 of die pad 5 and the outer peripheral surface of seal 3 is shortest distance t1 between first end portion 51 and lower surface 3B. Shortest distance t1 between first end portion 51 and lower surface 3B can be set to the same value as that of the conventional semiconductor device, and is, for example, more than or equal to 500 μm. When shortest distance t1 between first end portion 51 and lower surface 3B is set to 500 μm, shortest distance t2 between second end portion 52 and lower surface 3B can be set to more than or equal to 400 μm and less than or equal to 550 μm.

That is, semiconductor device 200 in accordance with Embodiment 5 includes frame 2 provided such that first end portion 51 and second end portion 52 of die pad 5 have the relative distance relationship described above.

Here, in the frame used for the conventional semiconductor device, the second end portion of the die pad is not provided to be closer to the frame body portion than the first end portion, in the direction perpendicular to the frame body portion. That is, the second end portion of the die pad in the conventional frame has been provided to be apart from the frame body portion in the direction perpendicular to the frame body portion, with 0 μm set as a lower limit value (which means that the second end portion is at the same level as the first end portion), and to be more apart from the frame body portion than the first end portion, in the direction apart from the frame body portion, with for example 150 μm set as an upper limit value. In this case, it has been difficult to improve dielectric strength by increasing the shortest distance between the second end portion and the lower surface of the seal without increasing the thickness of the seal.

In contrast, in frame 2 used for semiconductor device 200, since first end portion 51 and second end portion 52 of die pad 5 have the relationship described above, shortest distance t2 between second end portion 52 and lower surface 3B of seal 3 can be increased without increasing the thickness of seal 3. As a result, the package insulation failure rate of semiconductor device 200 can be reduced.

Figure 8:
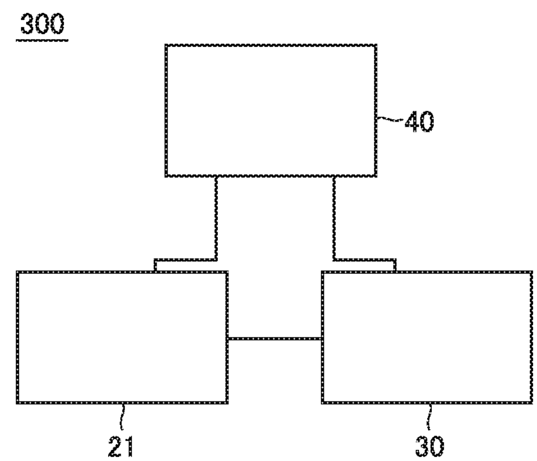
FIG. 8 is a block diagram for illustrating a manufacturing apparatus for the semiconductor device in accordance with Embodiment 5.
Figure 9:
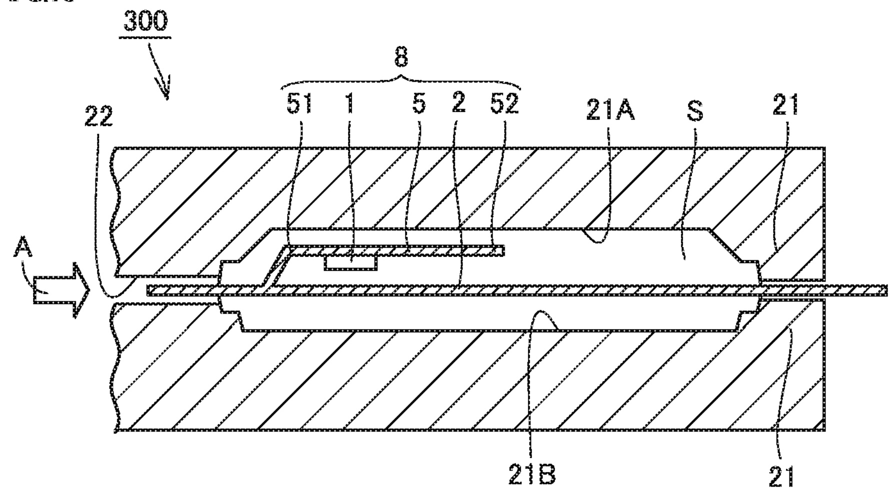
FIG. 9 is a cross sectional view for illustrating the manufacturing apparatus for the semiconductor device in accordance with Embodiment 5.

Next, a manufacturing apparatus 300 for the semiconductor device in accordance with Embodiment 5 (hereinafter simply referred to as a manufacturing apparatus) will be described with reference to FIGS. 8 and 9. Manufacturing apparatus 300 is used to manufacture semiconductor device 200 in accordance with Embodiment 5. Specifically, manufacturing apparatus 300 is a manufacturing apparatus used when seal 3 is formed to cover material to be sealed 8 including semiconductor element 1 and frame 2. Manufacturing apparatus 300 includes a mold 21, a supply unit 30 for supplying the flowable material which is to serve as seal 3, and a control unit 40 which controls mold 21 and supply unit 30.

Inside mold 21, a space S for arranging material to be sealed 8 therein and a connection path 22 for connecting space S and the outside are formed. On this occasion, mold 21 can hold, in space S, material to be sealed 8 in which die pad 5 is located on an upper side in the vertical direction than frame body portion 6. On this occasion, referring to FIG. 9, connection path 22 may be provided to extend along an extending direction of frame 2 for example when material to be sealed 8 is arranged in mold 21. Connection path 22 shown in FIG. 9 is formed to extend in a horizontal direction. Mold 21 is formed of, for example, an upper mold and a lower mold, and space S is a region surrounded by an end surface 21A of the upper mold and an end surface 21B of the lower mold.

Supply unit 30 supplies the flowable material which is to serve as seal 3 into space S, through connection path 22 of mold 21. Control unit 40 controls mold 21 and supply unit 30. Specifically, control unit 40 controls, for example, heating conditions and pressurization conditions for mold 21, and the supply amount of the flowable material which is to serve as the seal.

Figure 10:
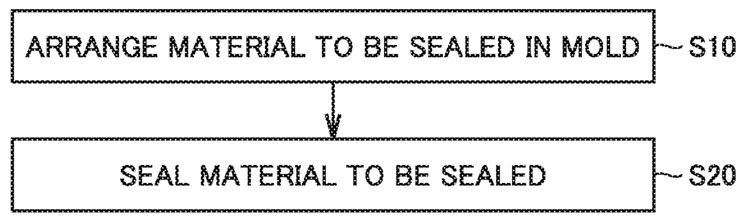
FIG. 10 is a flowchart for illustrating a manufacturing method for the semiconductor device in accordance with Embodiment 5.

Next, a manufacturing method for the semiconductor device in accordance with Embodiment 5 will be described with reference to FIGS. 8 to 10. The manufacturing method for the semiconductor device in accordance with Embodiment 5 is a manufacturing method for the semiconductor device in which material to be sealed 8 is sealed with seal 3, material to be sealed 8 including semiconductor element 1 held on die pad 5 and frame 2 having die pad 5, and is performed using manufacturing apparatus 300 for the semiconductor device in accordance with Embodiment 5 described above.

First, material to be sealed 8 is arranged inside mold 21 such that die pad 5 is located on the upper side in the vertical direction than frame body portion 6 (step (S10)). That is, material to be sealed 8 arranged and held in mold 21 is arranged such that semiconductor element 1 and frame 2 are placed upside down when compared with those in semiconductor device 200. Thereby, since material to be sealed 8 is arranged such that die pad 5 is located on the upper side in the vertical direction than frame body portion 6, second end portion 52 of die pad 5 comes to be located on a lower side in the vertical direction, that is, on a side closer to frame body portion 6, than first end portion 51, under the force of gravity. It is noted that frame 2 is provided such that the distance between second end portion 52 of die pad 5 and frame body portion 6 in the direction perpendicular to frame body portion 6 on this occasion is set to be more than or equal to a lower limit distance which is 50 μm shorter than the distance between first end portion 51 and frame body portion 6. In other words, frame 2 is provided such that, when material to be sealed 8 is arranged in mold 21, the shortest distance between end surface 21A of the upper mold of mold 21 and second end portion 52 of die pad 5 is longer than the shortest distance between end surface 21A and first end portion 51.

Next, material to be sealed 8 is sealed with seal 3, by introducing the flowable material which is to serve as seal 3 into mold 21 in which material to be sealed 8 is arranged and thereafter curing the material (step (S20)). The material which is to serve as seal 3 is, for example, epoxy resin, and is introduced into space S through connection path 22, from a direction indicated by an arrow A. On this occasion, inside space S of mold 21, by means of the previous step (S10), second end portion 52 of die pad 5 is in a state where it is located on the side closer to frame body portion 6 than first end portion 51. Accordingly, by introducing the flowable material which is to serve as seal 3 around material to be sealed 8 in such a state and curing the flowable material in this step (S20), shortest distance t2 between second end portion 52 of die pad 5 and lower surface 3B of seal 3 in obtained semiconductor device 200 can be longer than shortest distance t1 between first end portion 51 and lower surface 3B of seal 3, by up to 50 μm. That is, by means of this step (S20), the shortest distance between end surface 21A of the upper mold of mold 21 and second end portion 52 of die pad 5 serves as shortest distance t2 between lower surface 3B of seal 3 and second end portion 52 of die pad 5, and the shortest distance between end surface 21A of the upper mold of mold 21 and first end portion 51 serves as shortest distance t1 between lower surface 3B of seal 3 and first end portion 51 of die pad 5. Therefore, semiconductor device 200 can be obtained in which shortest distance t2 between second end portion 52 of die pad 5 and lower surface 3B of seal 3 is longer than shortest distance t1 between first end portion 51 and lower surface 3B of seal 3, by up to 50 μm.

As a result, even if second end portion 52 of die pad 5 is deformed toward the lower side in the vertical direction under the weight of semiconductor element 1 and its own weight, the shortest distance between second end portion 52 of die pad 5 and lower surface 3B of seal 3 can be prevented from being shortened in the step of sealing (S20). Therefore, a reduction in the dielectric strength of semiconductor device 200 can be prevented.

It is noted that semiconductor device 200 in accordance with Embodiment 5 may be provided such that second end portion 52 is more apart from frame body portion 6 than first end portion 51, in the direction apart from frame body portion 6, with 100 μm set as an upper limit value, as described above, and such semiconductor device 200 can also be obtained by the manufacturing method for the semiconductor device in accordance with Embodiment 5. In this case, for example in the case where material to be sealed 8 is arranged in mold 21 in step (S10), second end portion 52 only has to be provided such that, when the point where first end portion 51 is located is defined as a zero point and the lower side is defined as a positive side in the vertical direction, second end portion 52 is provided within the range of more than or equal to −50 μm and less than or equal to 100 μm. Thereby, semiconductor device 200 can be obtained in which, even if shortest distance t2 between second end portion 52 of die pad 5 and lower surface 3B of seal 3 is shorter than shortest distance t1 between first end portion 51 and lower surface 3B of seal 3, the difference (t1−t2) therebetween is suppressed to be less than or equal to 100 μm.

Figure 11:
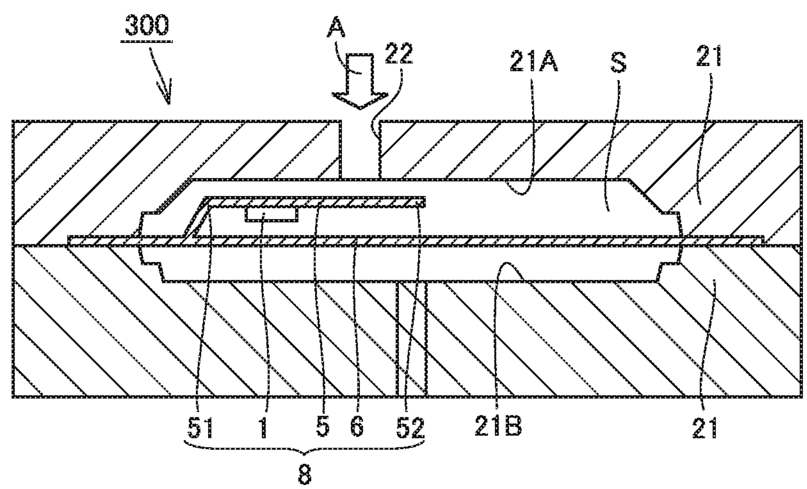
FIG. 11 is a cross sectional view for illustrating a variation of the manufacturing apparatus for the semiconductor device in accordance with Embodiment 5.

Although connection path 22 is provided to extend along the direction in which frame 2 extends in manufacturing apparatus 300 in accordance with Embodiment 5, connection path 22 is not limited thereto. Referring to FIG. 11, connection path 22 may be provided in mold 21, for example, above space S in the vertical direction. Also with such a configuration, the flowable material can be supplied into space S of mold 21 in a direction indicated by arrow A, with second end portion 52 of die pad 5 being arranged on the lower side in the vertical direction than first end portion 51, and thus the same effect as that of manufacturing apparatus 300 in accordance with Embodiment 5 can be exhibited. Preferably, connection path 22 is provided in mold 21 (for example, the upper mold) to be located directly above die pad 5. With such a configuration, die pad 5 is pressed downward by the flowable material when the flowable material is supplied from the upper side toward the lower side in the vertical direction, and thus second end portion 52 of die pad 5 can be more reliably suppressed from coming close to lower surface 3B of seal 3. As a result, semiconductor device 200 having a high dielectric strength and a reduced package insulation failure rate can be obtained. It is noted that mold 21 in this case may be, for example, a split mold having split surfaces.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A manufacturing method for a semiconductor device in which a material to be sealed is sealed with a seal, said material to be sealed including a semiconductor element and a frame which has a die pad holding said semiconductor element on a surface thereof and a frame body portion integrally formed with said die pad, said manufacturing method comprising the steps of:

arranging said material to be sealed inside a mold such that said die pad is located on an upper side in a vertical direction relative to said frame body portion, said semiconductor element being entirely disposed between said die pad and said frame body portion in the vertical direction when viewed in cross-section; and sealing said material to be sealed with said seal, by introducing a flowable material which is to serve as said seal into said mold in which said material to be sealed is arranged and thereafter curing said flowable material, wherein opposite ends of said frame are secured by portions of said mold respectively adjacent to opposite ends of a space within said mold, said flowable material is introduced into said mold through a connection path disposed directly above said die pad in the vertical direction when viewed in cross-section such that said die pad is disposed between said semiconductor element and said connection path, and said material to be sealed and held in said mold is arranged such that said semiconductor element and said frame are placed upside down when compared with those in said semiconductor device.

* * * * *